(12) United States Patent
Cao et al.

(10) Patent No.: US 10,290,244 B2
(45) Date of Patent: May 14, 2019

(54) DISPLAY PANEL AND OVERCURRENT PROTECTION CIRCUIT OF GATE DRIVER ON ARRAY CIRCUIT FOR DISPLAY PANEL

(71) Applicant: Shenzhen China Star Optoelectronics Technology Co., Ltd., Shenzhen, Guangdong (CN)

(72) Inventors: Dan Cao, Guangdong (CN); Xianming Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 333 days.

(21) Appl. No.: 15/118,790

(22) PCT Filed: Jun. 8, 2016

(86) PCT No.: PCT/CN2016/085358
§ 371 (c)(1),
(2) Date: Aug. 12, 2016

(87) PCT Pub. No.: WO2017/193437
PCT Pub. Date: Nov. 16, 2017

(65) Prior Publication Data
US 2018/0174501 A1   Jun. 21, 2018

(30) Foreign Application Priority Data

May 12, 2016   (CN) .......................... 2016 1 0321322

(51) Int. Cl.
*G09G 3/00*   (2006.01)
*G05F 1/10*   (2006.01)
(Continued)

(52) U.S. Cl.
CPC ............... *G09G 3/006* (2013.01); *G05F 1/10* (2013.01); *G09G 3/3611* (2013.01); *H02H 3/08* (2013.01);
(Continued)

(58) Field of Classification Search
CPC ........ F15B 1/021; F15B 1/103; F15B 20/007; F15B 2201/3153; F15B 2201/41;
(Continued)

(56) References Cited

U.S. PATENT DOCUMENTS

2003/0048587 A1*  3/2003  Lai ........................... H02H 3/04
                                                                 361/42
2007/0279028 A1* 12/2007  Lee ......................... H02M 1/32
                                                                323/284
(Continued)

FOREIGN PATENT DOCUMENTS

CN   104700811 A   6/2015
CN   105304050 A   2/2016
(Continued)

*Primary Examiner* — Thienvu V Tran
*Assistant Examiner* — Nicolas Bellido
(74) *Attorney, Agent, or Firm* — Andrew C. Cheng

(57) ABSTRACT

An overcurrent protection circuit of a GOA circuit is provided. A voltage signal from a control signal source of the GOA circuit is converted into a current signal, and then the current signal is amplified. Subsequently, a product of the amplified current signal and a load resistor is compared with a threshold voltage. If the product is larger than the threshold voltage, a controller controls a switch to output a low voltage level signal to ensure that the GOA circuit is at an overcurrent protected state. In this way, the panel is prevented from being damaged due to overabundant currents. Besides, the comparison of the amplified current signal is good for decreasing detection difficulties, enhancing precision of a measurement, and lowering risk of operation (Continued)

mistakes. Moreover, 2D and 3D modes in overcurrent protection through different load circuits improve the effect of protection.

18 Claims, 1 Drawing Sheet

(51) Int. Cl.
    *G09G 3/36*     (2006.01)
    *H02H 3/08*     (2006.01)
    *H03K 17/687*     (2006.01)
    *H03K 17/082*     (2006.01)

(52) U.S. Cl.
    CPC ......... *H03K 17/082* (2013.01); *H03K 17/687* (2013.01); *G09G 2310/0264* (2013.01); *G09G 2330/00* (2013.01); *G09G 2330/04* (2013.01); *G09G 2330/08* (2013.01)

(58) Field of Classification Search
    CPC ................ G09G 3/006; G09G 3/3611; G09G 2310/0264; G09G 2330/00; G09G 2330/04; G09G 2330/08; G05F 1/10; H02H 3/08; H02H 3/023; H02H 3/027; H02H 3/22; H02H 9/02; H02H 9/046; H03K 17/082; H03K 17/687; H01L 23/60; H01L 27/0248; H05K 1/0259
    USPC ...................................................... 361/57, 56
    See application file for complete search history.

(56) References Cited

U.S. PATENT DOCUMENTS

| | | | |
|---|---|---|---|
| 2010/0328831 A1* | 12/2010 | Zhang .................. | H02H 7/1213 361/93.1 |
| 2015/0181674 A1* | 6/2015 | Zhang .................. | H05B 33/083 315/186 |
| 2017/0187289 A1* | 6/2017 | Fukumoto ............... | H02M 1/08 |
| 2017/0256222 A1* | 9/2017 | Kuo ....................... | G09G 3/3677 |
| 2018/0097350 A1* | 4/2018 | Zhang ..................... | H02H 3/08 |

FOREIGN PATENT DOCUMENTS

| | | |
|---|---|---|
| CN | 105448261 A | 3/2016 |
| CN | 106067290 A | 11/2016 |
| KR | 1020140049725 A | 4/2014 |

* cited by examiner

DISPLAY PANEL AND OVERCURRENT PROTECTION CIRCUIT OF GATE DRIVER ON ARRAY CIRCUIT FOR DISPLAY PANEL

BACKGROUND OF THE INVENTION

1. Field of the Invention

The present invention relates to the field of the displays, and more particularly, to a display panel and an overcurrent protection circuit of a gate driver on array (GOA) circuit for the display panel.

2. Description of the Prior Art

The gate on array technique, short for GOA technique, is a technique that a gate driving circuit is produced on an array substrate directly in order to substitute for a driving chip fabricated from an external silicon chip. The merits of the GOA circuit formed on the edge of the panel directly are that the manufacturing process is simplified, production costs are also reduced, the integrity of the liquid crystal panel is enhanced, and that the panel becomes thinner. Besides, the wire on array (WOA) layout design is routing on the array substrate directly in order to substitute for a data signal on a flexible printed circuit (FPC) connecting to scanning lines and data lines. The WOA layout design effectively and obviously reduces the weight of the panel and costs. Once a driving signal in a gate line (CKV) in the WOA routing gets a short circuit or is abnormal, the panel may be damaged due to overabundant currents. In this way, the CKV needs more protective circuits.

SUMMARY OF THE INVENTION

To solve the problem of the conventional technology, the present invention proposes a display panel and an overcurrent protection circuit of a gate driver on array (GOA) circuit for the display panel.

According to the present disclosure, an overcurrent protection circuit of a gate driver on array (GOA) circuit includes a load circuit, an amplifying circuit, a comparator, a controller, and a switch. The amplifying circuit includes an input terminal connecting to a high voltage supply terminal and an output terminal grounded through the load circuit. The high voltage supply terminal is fed with a high voltage signal from a control signal source of the GOA circuit, for amplifying the high voltage signal. The comparator, connecting to the output terminal of the amplifying circuit, is configured to output a first high voltage level signal after comparing and ensuring that a voltage value of the output terminal of the amplifying circuit is larger than a voltage value of a threshold voltage. The controller, connecting to the comparator, is configured to output a second high voltage level signal after receiving the first high voltage level signal. The switch connects to the controller, the amplifying circuit, the high voltage supply terminal, a low voltage supply terminal, and a voltage output terminal. The low voltage supply terminal is configured to receive a low voltage signal from the control signal source of the GOA circuit. The switch is configured to conducting the low voltage input terminal and the voltage output after receiving the second high voltage level signal. The voltage output terminal outputs the low voltage signal.

Furthermore, the comparator is further used for outputting a first low voltage level signal after comparing and ensuring that the voltage value of the output terminal of the amplifying circuit is smaller than the voltage value of the threshold voltage. The controller outputs a second low voltage level signal to the switch after receiving the first low voltage level signal so that the switch conducts the high voltage supply terminal and the voltage output terminal and that the voltage output terminal outputs the high voltage signal.

Furthermore, the voltage value of the output terminal of the amplifying circuit is V=I*R, I is a current value of the amplified high voltage signal from the amplifying circuit, and R is a resistance of the load circuit.

Furthermore, a positive input terminal of the comparator connects to the output terminal of the amplifying circuit and the load circuit, a negative input terminal of the comparator receives the threshold voltage, and an output terminal of the comparator connects to the controller.

Furthermore, the amplifying circuit comprises a voltage amplifier connecting to the input terminal of the amplifying circuit, for receiving and amplifying the high voltage signal, and a voltage-current converter connecting between the voltage amplifier and the output terminal of the amplifying circuit, for converting the amplified high voltage signal into a current signal.

Furthermore, the load circuit comprises a first load circuit and a second load circuit; the first load circuit comprises a first resistor. The output terminal of the amplifying circuit is grounded through the first resistor. The second load circuit comprises a second resistor and a transistor. The transistor comprises a gate for receiving a display mode signal and a source grounded. The second resistor connects between the output terminal of the amplifying circuit and a drain of the transistor.

Furthermore, the display mode signal is a signal on a two dimensional (2D) mode, the transistor is at the cut off state, and the resistance R of the load circuit is a resistance of the first resistor.

Furthermore, the display mode signal is a signal on a three dimensional (3D) mode, the transistor is at the conducting state, and the resistance R of the load circuit is a connect-in-parallel resistance of the first resistor and the second transistor.

Furthermore, the switch comprises a first transistor and a second transistor. The first transistor comprises a gate connected between the voltage amplifier and the voltage-current converter, a source connecting to the voltage output terminal, and a drain connecting to the high voltage supply terminal. The second transistor comprises a gate connecting to the controller, a source connecting to the low voltage supply terminal, and a drain connecting to the voltage output terminal.

The present disclosure further proposes a display panel using the overcurrent protection circuit as provided above.

According to the display panel and the overcurrent protection circuit of the GOA circuit for the display panel proposed by the present invention, a voltage signal from a control signal source of the GOA circuit is converted into a current signal, and then the current signal is amplified. Subsequently, a product of the amplified current signal and a load resistor is compared with a threshold voltage. If the product is larger than the threshold voltage, a controller controls a switch to output a low voltage level signal to ensure that the GOA circuit is at overcurrent protected state. In this way, the panel is prevented from being damaged due to overabundant currents. Besides, the comparison of the amplified current signal is good for decreasing detection difficulties, enhancing precision of a measurement, and lowering risk of operation mistakes. Moreover, two dimensional (2D) and three dimensional (3D) modes in overcurrent protection through different load circuits improve the effect of protection.

DETAILED DESCRIPTION OF THE PREFERRED EMBODIMENTS

For better understanding embodiments of the present invention, the following detailed description taken in conjunction with the accompanying drawings is provided. Apparently, the accompanying drawings are merely for some of the embodiments of the present invention. Any ordinarily skilled person in the technical field of the present invention could still obtain other accompanying drawings without use laborious invention based on the present accompanying drawings.

Figure 1:
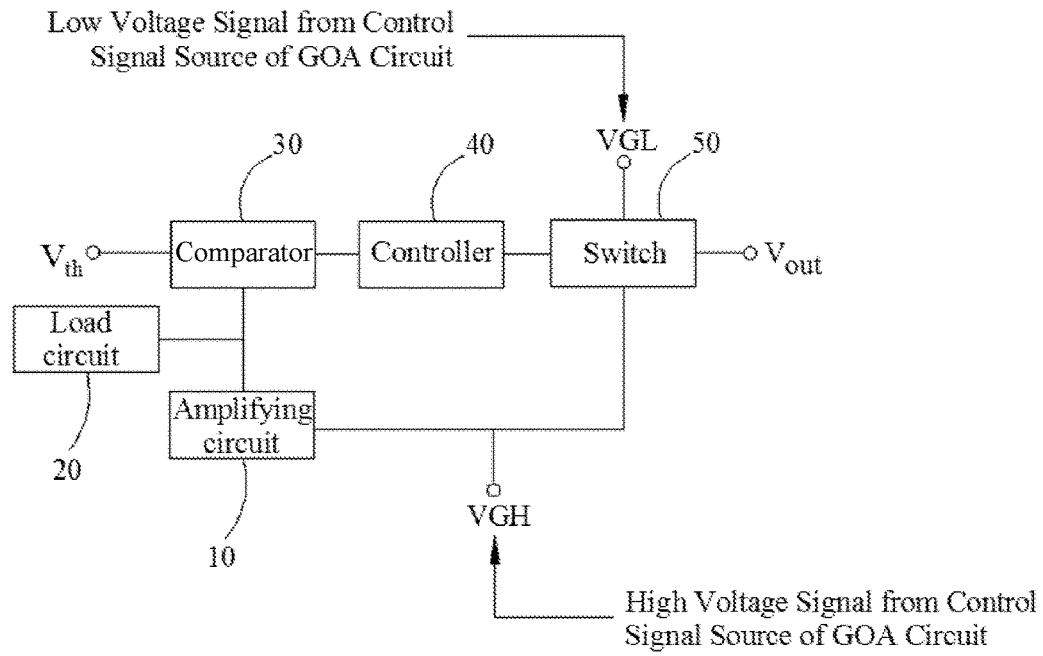
FIG. 1 shows a block diagram of an overcurrent protection circuit applied in a gate on array (GOA) circuit according to a preferred embodiment of the present invention.

Referring to FIG. 1 showing an overcurrent protection circuit applied in a gate on array (GOA) circuit according to a preferred embodiment of the present invention, the overcurrent protection circuit includes an amplifying circuit 10, a load circuit 20, a comparator 30, a controller 40, and a switch 50. An input terminal of the amplifying circuit 10 connects to a high voltage supply terminal VGH fed with a high voltage signal from a control signal source of the GOA circuit. The amplifying circuit 10 amplifies a current value of the high voltage signal. An output terminal of the amplifying circuit 10 is grounded through the loading circuit 20. The comparator 30 is connected between the output terminal of the amplifying circuit 10 and the controller 40. Specifically, a positive input terminal of the comparator 30 connects to the output terminal of the amplifying circuit 10, and a negative input terminal of the comparator 30 is fed with a threshold voltage Vth. The switch 50 connects to the amplifying circuit 10, the controller 40, the high voltage supply terminal VGH, a low voltage supply terminal VGL, and a voltage output terminal Vout.

Figure 2:
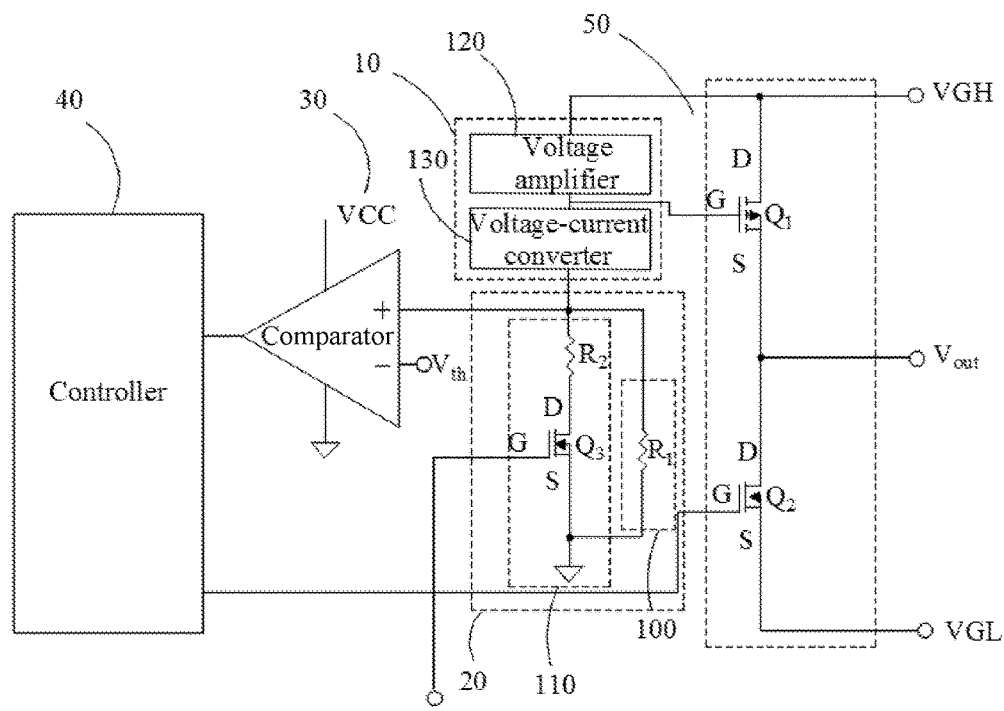
FIG. 2 shows a circuit diagram of an overcurrent protection circuit applied in a gate on array (GOA) circuit according to a preferred embodiment of the present invention.

Referring FIG. 2, the amplifying circuit 10 includes a voltage amplifier 120 and a voltage-current converter 130. The voltage amplifier 120 connects to the input terminal of the amplifying circuit 10. The voltage-current converter 130 connects between the voltage amplifier 120 and an output terminal of the amplifying circuit 10. The voltage amplifier 120 amplifies the voltage level signal from the control signal source of the GOA circuit. The voltage-current converter 130 converts the amplified high voltage signal into a current signal and transmits the current signal to the loading circuit 20. In this embodiment, the control signal source VGH outputs CKV signal. Because the CKV signal with small magnitudes is difficult to be detected, it is necessary to amplify the CKV signal to enhance precision of a measurement and to lower risk of operation mistakes. A voltage gain of the voltage amplifier 120 is set depending on practical design, for example, the voltage gain can be 10.

The voltage value of the output terminal of the amplifying circuit 10 is V=I*R where I is a current value of the current signal converted by the voltage-current converter 130, and R is a resistance of the load circuit 20. The positive input terminal of the comparator 30 connects to the output terminal of the amplifying circuit 10, so the voltage value of the positive input terminal of the comparator 30 is equal to V. The negative input terminal of the comparator 30 receives a threshold voltage from the threshold voltage Vth. The voltage value of the threshold voltage is Vref1, and then the comparator 30 compares V with Vref1. When V>Vref1 (i.e., i>Vref1/R) holds, the comparator 30 outputs a first high voltage level signal to the controller 40. After receiving the first high voltage level signal, the controller 40 outputs a second high voltage level signal to the switch 50. The switch 50 conducts the low voltage supply terminal VGL to the voltage output terminal Vout. Afterwards, the voltage output terminal Vout outputs a low voltage signal. At this time, the GOA circuit stays the overcurrent protected state. When V<Vref1 (i.e., i<Vref1/R) holds, the comparator 30 outputs a first low voltage level signal to the controller 40. After receiving the first low voltage level signal, the controller 40 outputs a second low voltage level signal to the switch 50. The switch 50 conducts the high voltage supply terminal VGH and the voltage output terminal Vout. Afterwards, the voltage output terminal Vout outputs a high voltage signal. At this time, the GOA circuit stays the normally operating state.

To ensure that the GOA circuit is better protected on two dimensional (2D) and three dimensional (3D) modes, the load circuit 20 comprises a first load circuit 100 and a second load circuit 110. Please refer to FIG. 2 again. Specifically, the first load circuit 100 comprises a first resistor R1. The resistance of the first resistor R1 is r1. The second load circuit 110 comprises a second resistor R2 and a transistor Q3. The resistance of the second resistor R2 is r2. The transistor Q3 comprises a gate connecting to a display mode signal source Vmode and a source grounded. The second resistor R2 connects between the output terminal of the amplifying circuit 10 and the drain of the transistor Q3. After connecting to the first resistor R1, the output terminal of the amplifying circuit 10 is grounded. The display mode comprises 2D and 3D modes. Preferably, the transistor is an n-channel metal-oxide-semiconductor transistor (NMOS). In other embodiments, the transistor can be other kinds of switch components such as a triode. If the display mode of the GOA circuit is the 2D mode, the display mode signal source Vmode outputs a low voltage level. Meanwhile, the gate of the transistor Q3 is at low voltage level and keeps the cut off state, the second load circuit 110 is not conducted, and the resistance of the output terminal of the amplifying circuit 10 is the resistance of the first resistor R1, i.e., r1. At this time, V=i*r1 holds, and the threshold current is Vref1/r1. If the display mode of the GOA circuit is the 3D mode, the display mode signal source Vmode outputs a high voltage level. Meanwhile, the gate of the transistor Q3 is applied with high voltage level and keeps the conducting state, the second load circuit 110 is conducted. Because the first resistance R1 and the second resistance R2 are connected in parallel, and the resistance of the output terminal of the amplifying circuit 10 is r1*r2/(r1+r2). At this time, V=i*r1*r2/(r1+r2) holds, and the threshold current is Vref1*(r1+r2)/r1*r2.

The switch 50 comprises a first transistor Q1 and a second transistor Q2. The first transistor Q1 comprises a gate connected between the voltage amplifier 120 and the voltage-current converter 130, a source connecting to the voltage output terminal Vout, and a drain connecting to the high voltage supply terminal VGH. The second transistor Q2 comprises a gate connecting to the controller 40, a source connecting to the low voltage supply terminal VGL, and a drain connecting to the voltage output terminal Vout. Preferably, the first transistor Q1 is a p-channel transistor (PMOS), and the second transistor is an n-channel transistor (NMOS). The gate of the second transistor Q2 receives an output signal from the controller 40, and the output signal is taken as a second high voltage level signal. The second transistor Q2 is at the conducting state. The gate of the first transistor Q1 receives the amplified high voltage signal from the voltage amplifier 120. The amplified high voltage signal is larger than an onset voltage of the first transistor Q1 so the first transistor Q1 is at the cut off state, the low voltage supply terminal VGL conducts the voltage output terminal Vout, and the voltage output terminal Vout outputs a low voltage signal. Meanwhile, the GOA circuit is at the overcurrent protected state. The gate of the second transistor Q2 receives an output signal from the controller 40, and the output signal is taken as a second low voltage level signal. The second transistor Q2 is at the cut off state. At this time, the gate of the first transistor Q1 receives the amplified high voltage signal from the voltage amplifier 120. The amplified high voltage signal is smaller than the onset voltage of the first transistor Q1 so the first transistor Q1 is at the conducting state, the high voltage supply terminal VGH conducts the voltage output terminal Vout, and the voltage output terminal Vout outputs a high voltage signal. Meanwhile, the GOA circuit is at the normally operating state.

The present disclosure also proposes a display panel using the overcurrent protection circuit of the GOA circuit as provided above. A voltage signal from a control signal source of the GOA circuit is converted into a current signal, and then the current signal is amplified. Subsequently, a product of the amplified current signal and a load resistor is compared with a threshold voltage. If the product is larger than the threshold voltage, a controller controls a switch to output a low voltage level signal to ensure that the GOA circuit is at overcurrent protected state. In this way, the panel is prevented from being damaged due to overabundant currents. Besides, the comparison of the amplified current signal is good for decreasing detection difficulties, enhancing precision of a measurement, and lowering risk of operation mistakes. Moreover, two dimensional (2D) and three dimensional (3D) modes in overcurrent protection through different load circuits improve the effect of protection.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An overcurrent protection circuit of a gate driver on array (GOA) circuit, comprising:
    a load circuit;
    an amplifying circuit, comprising an input terminal connecting to a high voltage supply terminal and an output terminal grounded through the load circuit, the high voltage supply terminal fed with a high voltage signal from a control signal source of the GOA circuit, for amplifying the high voltage signal;
    a comparator, connecting to the output terminal of the amplifying circuit, for outputting a first high voltage level signal after comparing and ensuring that a voltage value of the output terminal of the amplifying circuit is larger than a voltage value of a threshold voltage;
    a controller, connecting to the comparator, for outputting a second high voltage level signal after receiving the first high voltage level signal;
    a switch, connecting to the controller, the amplifying circuit, the high voltage supply terminal, a low voltage supply terminal, and a voltage output terminal, the low voltage supply terminal for receiving a low voltage signal from the control signal source of the GOA circuit; the switch for conducting the low voltage input terminal and the voltage output after receiving the second high voltage level signal; the voltage output terminal outputting the low voltage signal.

2. The overcurrent protection circuit of claim 1, wherein the comparator is further used for outputting a first low voltage level signal after comparing and ensuring that the voltage value of the output terminal of the amplifying circuit is smaller than the voltage value of the threshold voltage; the controller outputs a second low voltage level signal to the switch after receiving the first low voltage level signal so that the switch conducts the high voltage supply terminal and the voltage output terminal and that the voltage output terminal outputs the high voltage signal.

3. The overcurrent protection circuit of claim 2, wherein the voltage value of the output terminal of the amplifying circuit is V=I*R, I is a current value of the amplified high voltage signal from the amplifying circuit, and R is a resistance of the load circuit.

4. The overcurrent protection circuit of claim 3, wherein a positive input terminal of the comparator connects to the output terminal of the amplifying circuit and the load circuit, a negative input terminal of the comparator receives the threshold voltage, and an output terminal of the comparator connects to the controller.

5. The overcurrent protection circuit of claim 1, wherein the amplifying circuit comprises:
    a voltage amplifier, connecting to the input terminal of the amplifying circuit, for receiving and amplifying the high voltage signal;
    a voltage-current converter, connecting between the voltage amplifier and the output terminal of the amplifying circuit, for converting the amplified high voltage signal into a current signal.

6. The overcurrent protection circuit of claim 1, wherein the load circuit comprises a first load circuit and a second load circuit; the first load circuit comprises a first resistor; the output terminal of the amplifying circuit is grounded through the first resistor; the second load circuit comprises a second resistor and a transistor; the transistor comprises a gate for receiving a display mode signal and a source grounded; the second resistor connects between the output terminal of the amplifying circuit and a drain of the transistor.

7. The overcurrent protection circuit of claim 6, wherein the display mode signal is a signal on a two dimensional (2D) mode, the transistor is at the cut off state, and the resistance R of the load circuit is a resistance of the first resistor.

8. The overcurrent protection circuit of claim 6, wherein the display mode signal is a signal on a three dimensional (3D) mode, the transistor is at the conducting state, and the resistance R of the load circuit is a connect-in-parallel resistance of the first resistor and the second transistor.

9. The overcurrent protection circuit of claim 5, wherein the switch comprises a first transistor and a second transistor; the first transistor comprises a gate connected between the voltage amplifier and the voltage-current converter, a source connecting to the voltage output terminal, and a drain connecting to the high voltage supply terminal; the second transistor comprises a gate connecting to the controller, a source connecting to the low voltage supply terminal, and a drain connecting to the voltage output terminal.

10. A display panel, comprising an overcurrent protection circuit of a gate driver on array (GOA) circuit, the overcurrent protection circuit comprising:

a load circuit;

an amplifying circuit, comprising an input terminal connecting to a high voltage supply terminal and an output terminal grounded through the load circuit, the high voltage supply terminal fed with a high voltage signal from a control signal source of the GOA circuit, for amplifying the high voltage signal;

a comparator, connecting to the output terminal of the amplifying circuit, for outputting a first high voltage level signal after comparing and ensuring that a voltage value of the output terminal of the amplifying circuit is larger than a voltage value of a threshold voltage;

a controller, connecting to the comparator, for outputting a second high voltage level signal after receiving the first high voltage level signal;

a switch, connecting to the controller, the amplifying circuit, the high voltage supply terminal, a low voltage supply terminal, and a voltage output terminal, the low voltage supply terminal for receiving a low voltage signal from the control signal source of the GOA circuit; the switch for conducting the low voltage input terminal and the voltage output after receiving the second high voltage level signal; the voltage output terminal outputting the low voltage signal.

11. The display panel of claim 10, wherein the comparator is further used for outputting a first low voltage level signal after comparing and ensuring that the voltage value of the output terminal of the amplifying circuit is smaller than the voltage value of the threshold voltage; the controller outputs a second low voltage level signal to the switch after receiving the first low voltage level signal so that the switch conducts the high voltage supply terminal and the voltage output terminal and that the voltage output terminal outputs the high voltage signal.

12. The display panel of claim 11, wherein the voltage value of the output terminal of the amplifying circuit is $V=I*R$, I is a current value of the amplified high voltage signal from the amplifying circuit, and R is a resistance of the load circuit.

13. The display panel of claim 12, wherein a positive input terminal of the comparator connects to the output terminal of the amplifying circuit and the load circuit, a negative input terminal of the comparator receives the threshold voltage, and an output terminal of the comparator connects to the controller.

14. The display panel of claim 10, wherein the amplifying circuit comprises:

a voltage amplifier, connecting to the input terminal of the amplifying circuit, for receiving and amplifying the high voltage signal;

a voltage-current converter, connecting between the voltage amplifier and the output terminal of the amplifying circuit, for converting the amplified high voltage signal into a current signal.

15. The display panel of claim 10, wherein the load circuit comprises a first load circuit and a second load circuit; the first load circuit comprises a first resistor; the output terminal of the amplifying circuit is grounded through the first resistor; the second load circuit comprises a second resistor and a transistor; the transistor comprises a gate for receiving a display mode signal and a source grounded; the second resistor connects between the output terminal of the amplifying circuit and a drain of the transistor.

16. The display panel of claim 15, wherein the display mode signal is a signal on a two dimensional (2D) mode, the transistor is at the cut off state, and the resistance R of the load circuit is a resistance of the first resistor.

17. The display panel of claim 15, wherein the display mode signal is a signal on a three dimensional (3D) mode, the transistor is at the conducting state, and the resistance R of the load circuit is a connect-in-parallel resistance of the first resistor and the second transistor.

18. The display panel of claim 14, wherein the switch comprises a first transistor and a second transistor; the first transistor comprises a gate connected between the voltage amplifier and the voltage-current converter, a source connecting to the voltage output terminal, and a drain connecting to the high voltage supply terminal; the second transistor comprises a gate connecting to the controller, a source connecting to the low voltage supply terminal, and a drain connecting to the voltage output terminal.

* * * * *